(12) United States Patent
Codding et al.

(10) Patent No.: US 7,867,876 B2
(45) Date of Patent: Jan. 11, 2011

(54) METHOD OF THINNING A SEMICONDUCTOR SUBSTRATE

(75) Inventors: Steven R. Codding, Underfill Center, VT (US); Timothy C. Krywanczyk, Essex Junction, VT (US); Timothy E. Neary, Essex Junction, VT (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 12/342,393

(22) Filed: Dec. 23, 2008

(65) Prior Publication Data

US 2010/0155936 A1 Jun. 24, 2010

(51) Int. Cl.
H01L 21/30 (2006.01)

(52) U.S. Cl. .................................. 438/458; 438/459

(58) Field of Classification Search .................. None
See application file for complete search history.

(56) References Cited

U.S. PATENT DOCUMENTS

| 5,258,236 | A | 11/1993 | Arjavalingam et al. |
| 6,030,485 | A | 2/2000 | Yamada |
| 6,689,543 | B2 | 2/2004 | Kresge et al. |
| 6,905,946 | B2 | 6/2005 | Grigg et al. |
| 7,105,424 | B2 * | 9/2006 | Tsai et al. ................. 438/464 |
| 7,141,487 | B2 | 11/2006 | Periasamy et al. |
| 7,232,740 | B1 | 6/2007 | Mountain |
| 7,235,426 | B2 | 6/2007 | Tsai |
| 2006/0189095 | A1 * | 8/2006 | Ghyselen et al. ............ 438/458 |
| 2008/0293217 | A1 * | 11/2008 | Ghyselen et al. ............ 438/458 |

OTHER PUBLICATIONS

Donelon et al. "Lift-Off Stencil Created by Laser Ablation", IBM Technical Disclosure Bulletin.

* cited by examiner

*Primary Examiner*—Alonzo Chambliss
(74) *Attorney, Agent, or Firm*—Scully, Scott, Murphy & Presser, P.C.; Richard Kotulak, Esq.

(57) ABSTRACT

A C4 grind tape and a laser-ablative adhesive layer are formed on a front side of a semiconductor substrate. A carrier substrate is thereafter attached to the laser-ablative adhesive layer. The back side of the semiconductor substrate is thinned by polishing or grinding, during which the carrier substrate provides mechanical support to enable thinning of the semiconductor substrate to a thickness of about 25 μm. A film frame tape is attached to the back side of the thinned semiconductor substrate and the laser-ablative adhesive layer is ablated by laser, thereby dissociating the carrier substrate from the back side of the C4 grind tape. The assembly of the film frame tape, the thinned semiconductor substrate, and the C4 grind tape is diced. The C4 grind tape is irradiated by ultraviolet light to become less adhesive, and is subsequently removed.

18 Claims, 8 Drawing Sheets

METHOD OF THINNING A SEMICONDUCTOR SUBSTRATE

FIELD OF THE INVENTION

The present invention relates to methods of manufacturing semiconductor structures, and particularly to methods of thinning a semiconductor substrate and structures for effecting the same.

BACKGROUND OF THE INVENTION

Recent development in three-dimensional (3D) chip stacking technology employs thin semiconductor chips to enable vertical stacking of multiple semiconductor chips. Since a typical semiconductor substrate as manufactured in a normal semiconductor processing sequence has a thickness from about 500 μm to about 1,000 μm, formation of through-wafer vias (TWVs) that extend through the entirety of the thickness of the semiconductor substrate requires extraordinary processing sequences and high processing cost. An alternative is to thin a semiconductor substrate after the formation of semiconductor devices and interconnects on a semiconductor substrate is completed and prior to dicing the semiconductor into semiconductor chips, or "dies." By thinning the semiconductor substrate to a thickness less than 300 μm, through-wafer vias (TWVs) having a less height than the full thickness of the semiconductor substrate employed during a semiconductor manufacturing sequence may be employed to enable electrical connection between multiple semiconductor chips. In addition, thinned semiconductor substrate provides additional advantages such as improved thermal dissipation and improved device coupling across semiconductor devices located in different semiconductor chips that are vertically stacked.

Controlled Collapse Chip Connection (C4) packaging, which employs C4 balls each of which contacts a C4 pads on the semiconductor chip and another C4 pad on a packaging substrate, is employed in advanced semiconductor chips to accommodate a high number of input/output nodes, which may be up to 5,000. Each of these nodes is electrically connected to a C4 pad on a top surface of the semiconductor chip in a two dimensional array.

While desirable for enabling chip stacking with through-wafer vias (TWVs) having reduced thickness, thinning a semiconductor substrate containing C4 balls has achieved only limited success in the industry. FIGS. 1A-1D show a sequence of vertical cross-sectional views of a first exemplary prior art semiconductor structure.

Figure 1A:
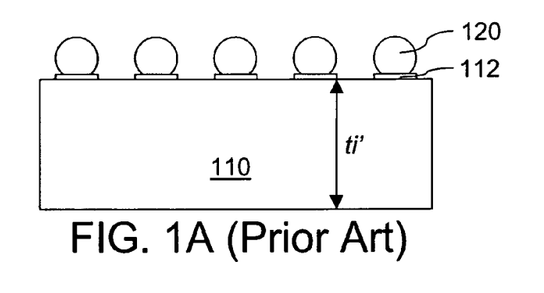

Referring to FIG. 1A, a C4 semiconductor substrate includes a semiconductor substrate 110, an array of C4 pads 112, and an array of C4 balls 120. The semiconductor substrate 110 includes at least one semiconductor device and at least one metal interconnect structure that is connected to the array of C4 pads 112. The thickness of the semiconductor substrate 110, which is herein referred to as an "initial thickness" ti', is typically from about 500 μm to about 1,000 μm, and typically depends on the diameter of the semiconductor substrate 110. The diameter of the C4 balls 120 is on the order of 100 μm.

Figure 1B:
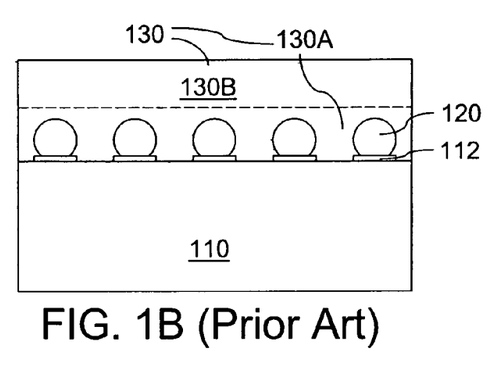

Referring to FIG. 1B, a C4 grind tape 130, which comprises a tape adhesive layer 130A and a tape base layer 130B, is applied to the top surface of the semiconductor substrate 110 containing the C4 balls 120. The tape base layer 130B comprises a polymer material or a plastic material. The tape adhesive layer 130A comprises an ultraviolet (UV) sensitive adhesive material, which loses adhesive property upon exposure to ultraviolet light. For this reason, upon application of the C4 grind tape 130 onto the semiconductor substrate 10, the C4 grind tape 130 is kept away from exposure to ultraviolet light until thinning of the semiconductor substrate is completed. The thickness of the tape adhesive layer 130A is greater than the height of the C4 ball 120, which is on the order of 100 μm.

Figure 1C:
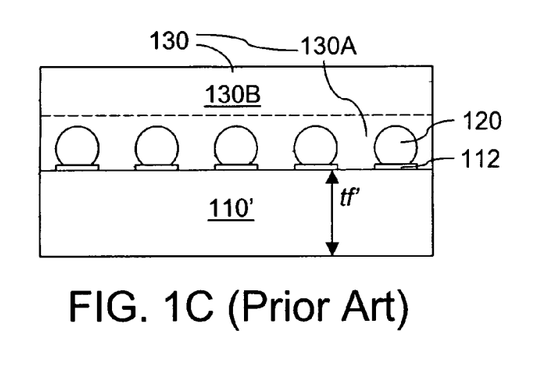

Referring to FIG. 1C, the semiconductor substrate 110 is thinned by polishing and/or grinding. The C4 grind tape 130 provides mechanical support for the semiconductor substrate 110 during the thinning process, which produces a thinned semiconductor substrate 110'. Since the C4 grind tape 130 is not a rigid structure and the thickness of the tape adhesive layer 130A typically exceeds 100 μm, support of the semiconductor substrate 110' is not firm and the thinned semiconductor substrate 110' is subject to various stress during handling of the assembly of the C4 grind tape 130 and the thinned semiconductor substrate 110'. For this reason, there is a limit to the thickness of the thinned semiconductor substrate 110', which is herein referred to as a "final thickness" tf. A practical lower limit on the final thickness tf is about 150 μm.

Figure 1D:
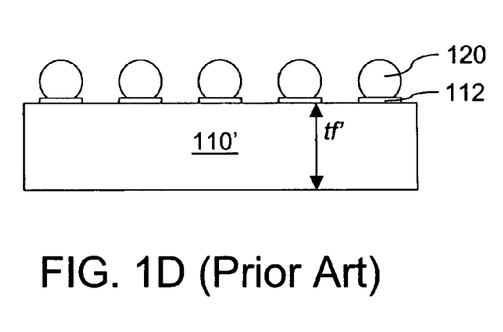

Referring to FIG. 1D, the C4 grind tape 130 is irradiated by ultraviolet light, which deactivates the oligamer in the tape adhesive layer 130A to remove cross-linking therein. The tape adhesive layer 130A thus loses adhesive property upon the ultraviolet irradiation. The C4 grind tape 130 is the peeled off the thinned semiconductor substrate 110' and the C4 balls 120. While the final thickness tf is less than the initial thickness ti', the mechanical characteristics of the tape adhesive layer 130A places a practical limitation on the final thickness tf, i.e., the final thickness tf is greater than about 200 μm. When thinning of the semiconductor substrate 110 to a thickness less than about 200 μm, a substrate breakage readily occurs, rendering the thinning process commercially not viable.

An alternate scheme for thinning a semiconductor substrate containing wirebond pads instead of C4 balls is known in the art. FIGS. 2A-2G show a sequence of vertical cross-sectional views of a second exemplary prior art semiconductor structure.

Figure 2A:
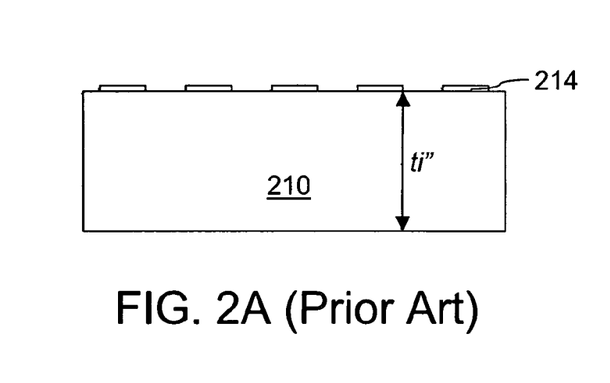

Referring to FIG. 2A, a wirebond semiconductor substrate includes a semiconductor substrate 210 and an array of wirebond pads 214. The semiconductor substrate 210 includes at least one semiconductor device and at least one metal interconnect structure that is connected to the array of wirebond pads 214. The thickness of the semiconductor substrate 210, which is herein referred to as an "initial thickness" ti", is typically from about 500 μm to about 1,000 μm, and typically depends on the diameter of the semiconductor substrate 210. The height of the wirebond pads 214 is on the order of 2 μm.

Figure 2B:
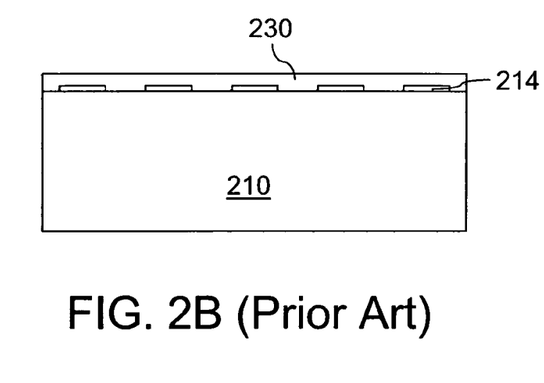

Referring to FIG. 2B, a deactivatable adhesive layer 230 is applied to the top surface of the semiconductor substrate 210 containing the wirebond pads 214. The deactivatable adhesive layer 230 comprises an adhesive material, which may be subsequently deactivated upon exposure to heat or chemical treatment. The thickness of the deactivatable adhesive layer 230 is typically from about 10 μm to about 20 μm.

Figure 2C:
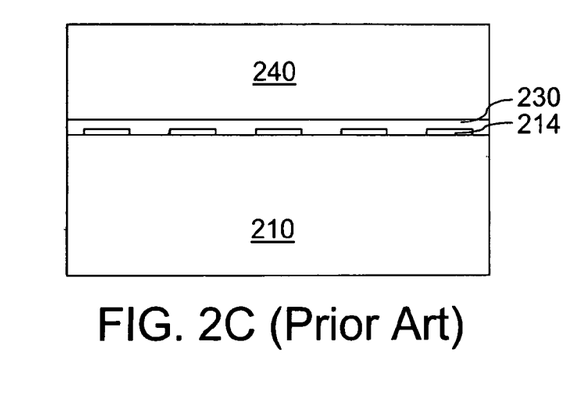

Referring to FIG. 2C, a carrier substrate 240 is bonded to the deactivatable adhesive layer 230. The carrier substrate 240 comprises a solid material that provides structural support during subsequent thinning of the semiconductor substrate 210.

Figure 2D:
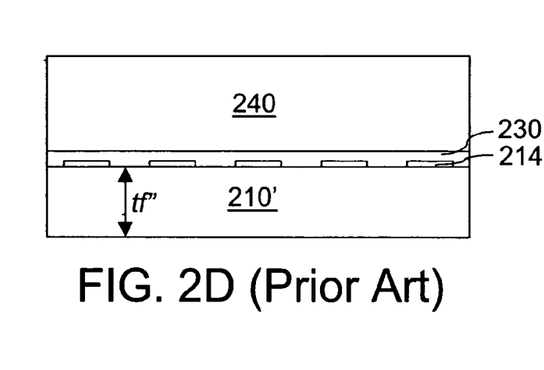

Referring to FIG. 2D, the semiconductor substrate 210 is thinned by polishing and/or grinding. The carrier substrate 240 provides mechanical support for the semiconductor substrate 210 during the thinning process, which produces a thinned semiconductor substrate 210'. The thickness of the thinned semiconductor substrate 210', which is herein referred to as a "final thickness" tf". The final thickness tf" may be less than 50 μm.

Figure 2E:
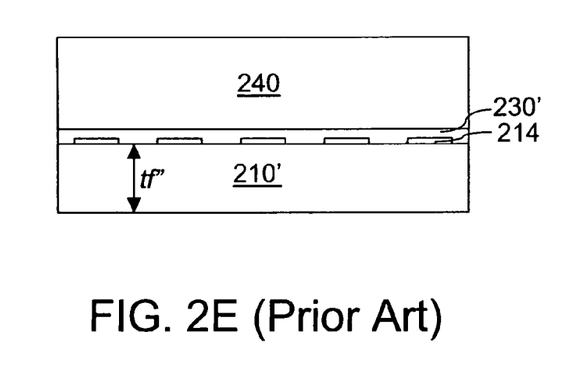

Referring to FIG. 2E, the deactivatable adhesive layer 230 is deactivated to lose adhesive property by exposure to heat treatment or chemical treatment. In case heat treatment is employed, the temperature of the deactivatable adhesive layer 230 may be elevated up about 160° C. In case chemical treatment is employed, a chemical is employed to change the property of the deactivatable adhesive layer 230 by reaction. The deactivatable adhesive layer 230 may be porous to allow percolation of the chemical in this case. Upon deactivation, the deactivatable adhesive layer 230 becomes a deactivated layer 230', which is substantially less adhesive than the deactivatable adhesive layer 230 prior to deactivation. The thermal cycling or the chemical treatment may have adverse impact on the thinned semiconductor substrate 210 through thermal, chemical, or structural degradation.

Figure 2F:
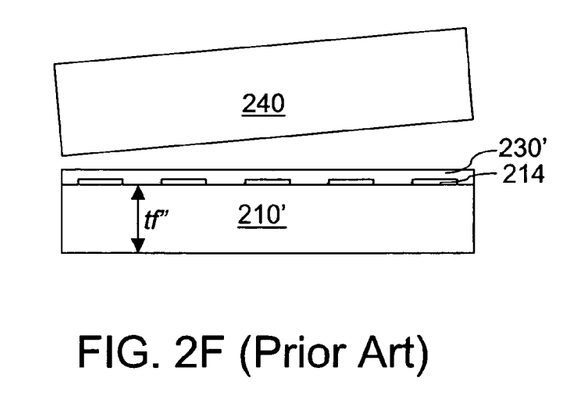
Figure 2G:
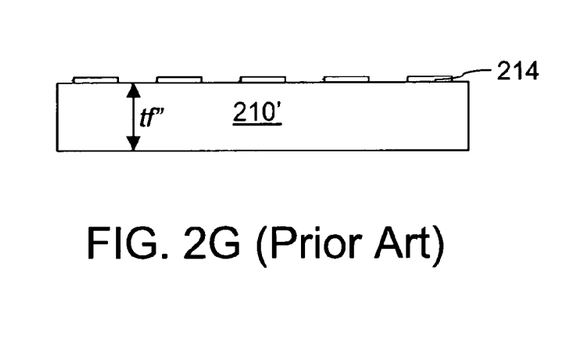

Referring to FIG. 2F, the carrier substrate 240 is removed from the deactivated layer 230'. Referring to FIG. 2G, the deactivated layer 230' is delaminated from the thinned semiconductor layer 210'.

As far as C4 semiconductor substrates, i.e., semiconductor substrates having C4 balls which typically have a diameter about 100 μm, are concerned, the thickness of thinned semiconductor substrates is limited to a thickness greater than about 200 μm since the C4 grind tape 130 of FIG. 1B does not provide sufficient mechanical support during the thinning of the semiconductor substrate in the assembly of a C4 semiconductor substrate 110 and a C4 grind tape 130. In view of this, there exists a need for a method of thinning a C4 semiconductor substrate to a thickness less than about 200 μm without subjecting a thinned C4 semiconductor substrate to a significant risk of breakage.

As far as wirebond semiconductor substrates, i.e., semiconductor substrates have wirebond pads, are concerned, the thinned semiconductor substrate 210' may be subjected to harmful thermal or chemical treatment, which is necessary to deactivate the deactivatable adhesive layer 230 and to form a deactivated layer 230' therefrom but tends to damage the thinned semiconductor substrate thermally, structurally, and/or chemically. In view of this, there exists a need for a method of thinning a wirebond semiconductor substrate without subjecting a thinned wirebond semiconductor substrate to exposure to heat treatment or chemical treatment.

SUMMARY OF THE INVENTION

The present invention addresses the needs described above by providing a method of thinning a semiconductor substrate employing a C4 grind tape, a laser-ablative adhesive layer, and a carrier substrate, in which the laser-ablative adhesive layer is removed by laser ablation.

In the present invention, a C4 grind tape is attached to the front side of a semiconductor substrate containing C4 balls or wirebond pads. A laser-ablative adhesive layer comprising a laser ablatable material is formed on the backside of the C4 grind tape. A carrier substrate is attached to the laser-ablative adhesive layer. The back side of the semiconductor substrate is thinned by polishing or grinding, during which the carrier substrate provides mechanical support to enable thinning of the semiconductor substrate to a thickness of about 25 μm. A film frame tape is attached to the back side of the thinned semiconductor substrate and the laser-ablative adhesive layer is ablated by laser, thereby dissociating the carrier substrate from the back side of the C4 grind tape. The assembly of the film frame tape, the thinned semiconductor substrate, and the C4 grind tape is diced. The C4 grind tape is irradiated by ultraviolet light to become less adhesive, and is subsequently removed.

According to an aspect of the present invention, a method of forming a semiconductor structure is provided, which comprises:

applying an adhesive tape on a semiconductor substrate;

applying a laser-ablative adhesive layer on a carrier substrate;

bonding the adhesive tape to the laser-ablative adhesive layer;

thinning a back side of the semiconductor substrate; and separating the carrier substrate from the adhesive tape by laser ablation of the laser-ablative adhesive layer.

In one embodiment, the semiconductor substrate is a C4 semiconductor substrate including C4 balls. The adhesive tape may abut the C4 balls.

In another embodiment, the semiconductor substrate is a wirebond semiconductor substrate including wirebond pads. The adhesive tape may abut the wirebond semiconductor substrate.

In even another embodiment, the adhesive tape comprises a tape base layer and a tape adhesive layer, wherein the tape adhesive layer abuts the semiconductor substrate, and the carrier substrate abuts the tape base layer.

In yet another embodiment, the tape base layer comprises a polymer material or a plastic material.

In still another embodiment, the tape adhesive layer comprises an ultraviolet (UV) sensitive adhesive material which loses adhesive property upon exposure to ultraviolet light.

In still yet another embodiment, the tape adhesive layer has a thickness of at least 100 μm.

In a further embodiment, the adhesive tape is a C4 grind tape.

In an even further embodiment, the laser-ablative adhesive layer comprises a polymeric material.

In a yet further embodiment, the beam energy of a laser impinging on the laser-ablative adhesive layer is at least 50 mJ/cm$^2$.

In a still further embodiment, the laser-ablative adhesive layer has a thickness from about 5 μm to about 25 μm.

In a still yet further embodiment, the carrier substrate is one of a quartz substrate, a glass substrate, a semiconductor substrate, a ceramic substrate, and a metallic substrate.

In further another embodiment, the carrier substrate and the semiconductor substrate have substantially the same area.

In even further another embodiment, the semiconductor substrate has a thickness from about 500 μm to about 1,000 μm prior to thinning, and has a thickness from about 20 μm to about 150 μm after thinning.

In yet further another embodiment, the method further comprises applying a film frame tape to the back side of the thinned semiconductor substrate.

In still further another embodiment, the method further comprises dicing an assembly of the film frame tape, the semiconductor substrate, and the adhesive tape.

In still yet further another embodiment, the method further comprises:

deactivating the adhesive tape, whereby adhesive strength of the adhesive tape is reduced; and delaminating the adhesive tape off the semiconductor substrate.

According to another aspect of the present invention, a semiconductor structure is provided, which comprises:

an adhesive tape abutting a semiconductor substrate;

a laser-ablative adhesive layer abutting the adhesive tape; and a carrier substrate abutting the laser-ablative adhesive layer.

In one embodiment, the semiconductor substrate is a C4 semiconductor substrate including C4 balls.

In another embodiment, the semiconductor substrate is a wirebond semiconductor substrate including wirebond pads.

In even another embodiment, the adhesive tape comprises a tape base layer and a tape adhesive layer, wherein the tape adhesive layer abuts the semiconductor substrate, and the carrier substrate abuts the tape base layer.

In yet another embodiment, the tape base layer comprises a polymer material or a plastic material.

In still another embodiment, the tape adhesive layer comprises an ultraviolet (UV) sensitive adhesive material which loses adhesive property upon exposure to ultraviolet light.

In still yet another embodiment, the tape adhesive layer has a thickness of at least 100 μM.

In a further embodiment, the laser-ablative adhesive layer comprises a polymeric material having a thickness from about 5 μm to about 25 μm.

In an even further embodiment, the carrier substrate is one of a quartz substrate, a glass substrate, a semiconductor substrate, a ceramic substrate, and a metallic substrate.

In a still further embodiment, the carrier substrate and the semiconductor substrate have substantially the same area.

In a still yet further embodiment, the semiconductor structure further comprises a film frame tape abutting the back side of the semiconductor substrate, wherein the semiconductor substrate has a thickness from about 20 μm to about 150 μm.

BRIEF DESCRIPTION OF THE DRAWINGS

FIGS. 1A-1D are sequential vertical cross-sectional views of a first exemplary prior art semiconductor structure. FIG. 1A corresponds to a step after formation of a C4 semiconductor substrate. FIG. 1B corresponds to a step after application of a C4 grind tape 130 on the C4 semiconductor substrate. FIG. 1C corresponds to a step after thinning of the C4 semiconductor substrate. FIG. 1D corresponds to a step after removal of the C4 grind tape.

FIGS. 2A-2G are sequential vertical cross-sectional views of a second exemplary prior art semiconductor structure. FIG. 2A corresponds to a step after formation of a wirebond semiconductor substrate. FIG. 2B corresponds to a step after application of a deactivatable adhesive layer 230. FIG. 2C corresponds to a step after bonding of a carrier substrate 240. FIG. 2D corresponds to a step after thinning of the wirebond semiconductor substrate. FIG. 2E corresponds to a step after deactivation of the deactivatable adhesive layer 230 is deactivated to form a deactivated layer 230'. FIG. 2F corresponds to a step of removal of the carrier substrate 240. FIG. 2G corresponds to a step after delamination of the deactivated layer 230'.

FIGS. 3A-3I are sequential vertical cross-sectional views of a first exemplary semiconductor structure according to a first embodiment of the present invention. FIG. 3A corresponds to a step after formation of a C4 semiconductor substrate. FIG. 3B corresponds to a step after application of an adhesive tape 30. FIG. 3C corresponds to a step after application of a laser-ablative adhesive layer 36 on a carrier substrate 40. FIG. 3D corresponds to a step after bonding of the laser-ablative adhesive layer 36 to the adhesive tape 30. FIG. 3E corresponds to a step after thinning of the C4 semiconductor substrate. FIG. 3F corresponds to a step after application of a film frame tape on a back side of the C4 semiconductor substrate. FIG. 3G corresponds to a step of laser ablation of the laser-ablative adhesive layer 36. FIG. 3H corresponds to a step after dicing of the C4 semiconductor substrate. FIG. 3I corresponds to a step after deactivation and removal of the adhesive tape 30.

FIGS. 4A-4I are sequential vertical cross-sectional views of a second exemplary semiconductor structure according to a second embodiment of the present invention. FIG. 4A corresponds to a step after formation of a wirebond semiconductor substrate. FIG. 4B corresponds to a step after application of an adhesive tape 30. FIG. 4C corresponds to a step after application of a laser-ablative adhesive layer 36 on a carrier substrate 40. FIG. 4D corresponds to a step after bonding of the laser-ablative adhesive layer 36 to the adhesive tape 30. FIG. 4E corresponds to a step after thinning of the wirebond semiconductor substrate. FIG. 4F corresponds to a step after application of a film frame tape on a back side of the wirebond semiconductor substrate. FIG. 4G corresponds to a step of laser ablation of the laser-ablative adhesive layer 36. FIG. 4H corresponds to a step after dicing of the wirebond semiconductor substrate. FIG. 4I corresponds to a step after deactivation and removal of the adhesive tape 30.

DETAILED DESCRIPTION OF THE INVENTION

As stated above, the present invention relates to methods of thinning a semiconductor substrate and structures for effecting the same, which are now described in detail with accompanying figures. It is noted that like and corresponding elements mentioned herein and illustrated in the drawings are referred to by like reference numerals. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 3A:
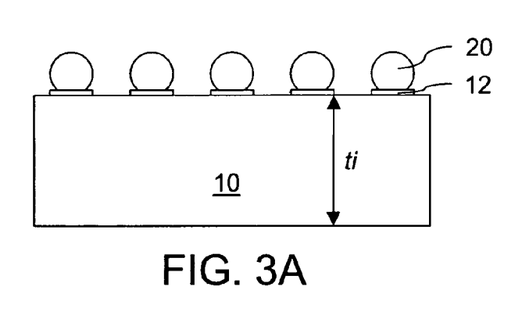

Referring to FIG. 3A, a first exemplary semiconductor structure according to a first embodiment of the present invention comprises a C4 semiconductor substrate, which is a semiconductor substrate with C4 balls 20 thereupon. Specifically, the first exemplary semiconductor structure comprises a semiconductor substrate 10, an array of C4 pads 12, and an array of C4 balls 20. The semiconductor substrate 10 comprises a substrate containing a semiconductor material. The semiconductor substrate 10 comprises at least one semiconductor device (not shown) electrically connected to the array of C4 balls 20 through at least one metal interconnect structure (not shown). The thickness of the semiconductor substrate 10 is herein referred to as an initial thickness ti, and may be from about 500 μm to about 1,000 μm, although lesser and greater thicknesses are contemplated herein. Typically, the initial thickness ti is determined by the material of the semiconductor substrate 10 and the size, e.g., the diameter, of the semiconductor substrate 10.

Typical two dimensional array configurations for the C4 pads 12 include 4 on 8 configuration and 3 on 6 configuration. The 4 on 8 configuration employs C4 balls 12 having a diameter of about 4 mils (~100 microns) and a pitch of about 8 mils (~200 microns) in a rectangular array. The 3 on 6 configuration employs C4 balls 12 having a diameter of about 3 mils (~75 microns) and a pitch of about 6 mils (~150 microns) in a rectangular array. Thus, more than 5,000 C4 balls may be formed on one semiconductor chip, which may be typically about 2 cm×2 cm in size. The semiconductor substrate 10 includes a plurality of semiconductor chips. The distance between the top surface of the semiconductor substrate 10 and the top surfaces of the C4 balls is on the order of the diameter of the C4 balls 20 since the thickness of the C4 pads is typically from about 1 μm to about 5 μm, and the diameter of the C4 balls 20 is from about 75 μm to about 100 μm.

Figure 3B:
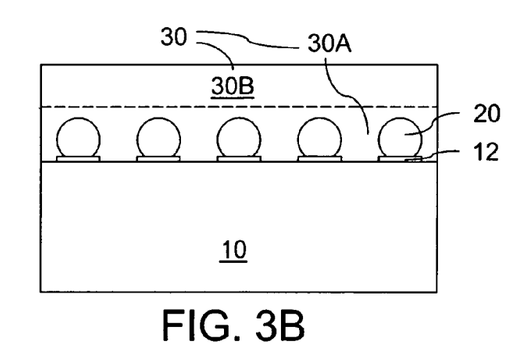

Referring to FIG. 3B, an adhesive tape 30 is applied over the top surface of the semiconductor layer 10 and the C4 balls 20. The adhesive tape 30 comprises a tape base layer 30B and a tape adhesive layer 30A. The adhesive tape 30 is formed by coating an adhesive material on the tape base layer 30B. The adhesive material constitutes the tape adhesive layer 30A.

The tape base layer 30B comprises a material providing structural support to the tape adhesive layer 30A, and may comprise a polymer material or a plastic material. The tape adhesive layer 30A may display intrinsic adhesive property without application of external force or other activation mechanisms, or may display adhesive property upon activation by pressure, heat, or another activation mechanism. The tape adhesive layer 30A comprises a deactivatable adhesive material which provides adhesive strength prior to deactivation but substantially loses adhesive property upon deactivation. In one case, the deactivation mechanism may be exposure to ultraviolet light. For example, the adhesive material in the tape adhesive layer 30A may comprise an olygamer that loses cross-linkage upon exposure to ultraviolet (UV) light. Alternately, other deactivation mechanisms such as heat, low temperature, chemical exposure, etc. may be employed.

The thickness of the tape adhesive layer 30A is greater than the diameter of the C4 balls 20, which is typically from about 75 μm to about 100 μm. Preferably, the thickness of the tape adhesive layer 30A is at least about 100 μm, and more preferably, the thickness of the tape adhesive layer 30A is greater than 100 μm. For example, the thickness of the tape adhesive layer 30A may be from about 100 μm to about 1,000 μm. Adjustment of the thickness of the tape adhesive layer 30A with the diameter of the C4 balls 20 is also contemplated herein. The thickness of the tape base layer 30B is from about 50 μm to about 300 μm, and typically from about 100 μm to about 200 μm, although lesser and greater thicknesses are also contemplated herein.

Examples of the adhesive tape 30 include commercially available C4 grind tapes such as a Nitto™ ultraviolet sensitive C4 grind tape employing 100 μm thick polyester film as the tape base layer 30B and a Furukawa™ ultraviolet sensitive C4 grind tape employing 100 μm thick polyolefin film as the tape base layer 30B. Acrylic adhesive materials are typically employed as a ultraviolet sensitive material in the tape adhesive layer 30A in the commercially available C4 grain tapes, which deactivates and significantly loses adhesive property upon exposure to ultraviolet light.

The tape adhesive layer 30A is applied over the semiconductor substrate 10 and the C4 balls 20 in a conformal manner to avoid forming bubbles between the tape adhesive layer 30A and the C4 balls 20 and/or the semiconductor layer 10. This may be effected by applying the adhesive tape 30 from one side of the semiconductor substrate 10 toward another side of the semiconductor substrate 10 while applying pressure on the back side of the tape adhesive, i.e., the exposed surface of the tape base layer 30B. Since the thickness of the tape adhesive layer 30A exceeds the distance between the top surface of the C4 balls 50 and the top surface of the semiconductor substrate 10, the C4 balls 20 are embedded in the tape adhesive layer 30A, but do not touch the tape base layer 30B.

Figure 3C:
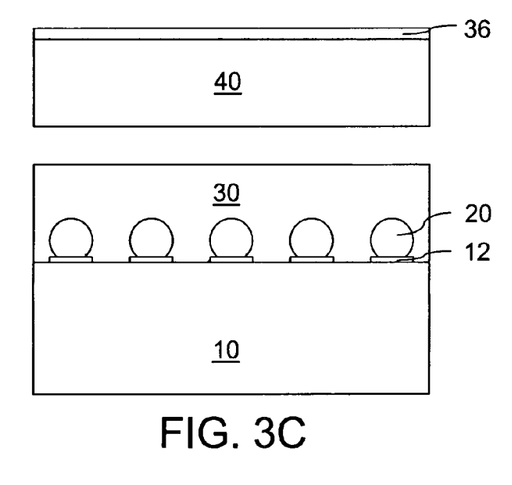

Referring to FIG. 3C, a carrier substrate 40 is provided, which may be a quartz substrate, a glass substrate, a semiconductor substrate, a ceramic substrate, or a metallic substrate. The carrier substrate 40 comprises a rigid material having sufficient mechanical strength to enable handling of the semiconductor substrate 10 after thinning once the carrier substrate 40 is bonded to the semiconductor substrate 10.

The thickness of the carrier substrate 40 may be from about 100 μm to about 1,000 μm, although lesser and greater thicknesses are also contemplated herein. Preferably, size of the carrier substrate 40 and the size of the semiconductor substrate 10 are substantially the same. Specifically, the lateral dimensions of the carrier substrate 40 and the lateral dimensions of the semiconductor substrate 10 are substantially the same. For example, if the diameter of the carrier substrate 40 is 200 mm, the diameter of the carrier substrate 40 is substantially the same as 200 mm.

A laser-ablative adhesive layer 36 is applied over a surface of the carrier substrate 40. The laser-ablative adhesive layer 36 comprises an adhesive material that may be removed by laser ablation. The laser-ablative adhesive layer 36 may comprise a polymer material having adhesive properties.

Application and laser ablation of a laser-ablative adhesive material is known in the art. U.S. Pat. No. 5,258,236 to Arjavalingam et al. and Donelon et al, "Lift-Off Stencil Created by Laser Ablation," IBM Technical Disclosure Bulletin, October 1985, p. 2034, which illustrate laser-ablative adhesive materials, are incorporated herein by reference.

Laser-ablative adhesive materials are also commercially available. Commercially available laser-ablative adhesive materials include HD3003-X1 and HD3007 from HD Microsystems™. HD3003-X1 includes a polar solvent N-methylpyrrolidone (NMP), and HD3007 includes Propylene Glycol Methyl Ether Acetate (PGMEA) and butyrolactone (BLO).

The laser-ablative adhesive layer 36 may be formed by spin coating, painting, spraying, or any other dispensing method. The thickness of the laser-ablative adhesive layer 36 may be from about 5 μm to about 25 μm, although lesser and greater thicknesses are also contemplated herein.

Figure 3D:
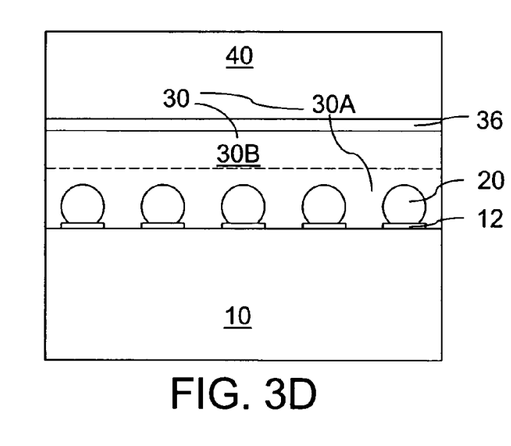

Referring to FIG. 3D, the side of the carrier substrate 40 having the laser-ablative adhesive layer 36 and the top surface of the adhesive tape 30, which is the exposed surface of the tape base layer 30B, are brought into contact. The carrier substrate 40 and the semiconductor substrate 10 are pressed against each other to bond the carrier substrate 40 with the assembly of the adhesive tape 30, the semiconductor substrate 10, and the C4 pads 12 and the C4 balls 20 therebetween through the laser-ablative adhesive layer 36. To prevent formation of any air bubble, the bonding of the carrier substrate 40 with the adhesive tape 30 may be effected from one side of the laser-ablative adhesive layer 36 toward another side of the laser ablative adhesive layer 36.

Figure 3E:
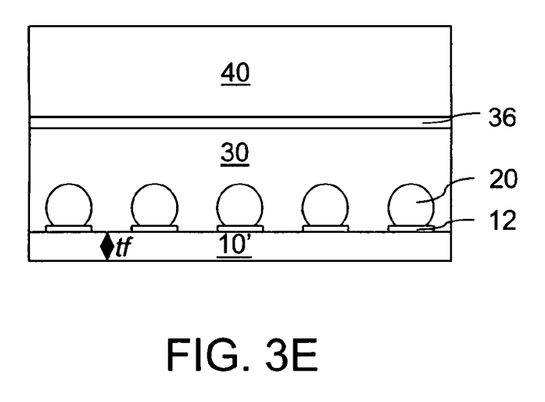

Referring to FIG. 3E, the semiconductor substrate 10 is thinned by polishing, grinding, or other equivalent methods so that material is removed from the bottom surface of the semiconductor substrate 10. The thickness of the semiconductor substrate 10 decreases from the initial thickness ti (See FIG. 3A) to a final thickness tf. The semiconductor substrate 10 having the final thickness tf is herein referred to as a thinned semiconductor substrate 10'. The carrier substrate 40 provides mechanical support to the semiconductor substrate 10 throughout the process of thinning, enabling thinning of the semiconductor substrate 10 to a thickness less than 150 μm. The final thickness tf of the thinned semiconductor substrate 10' may be from about 20 μm to about 150 μm without causing undue risk of breakage of the semiconductor substrate 10 during or after thinning. Thus, the present invention allows thinning of the semiconductor substrate 10 of a C4 semiconductor substrate (10, 12, 20) to a thickness less than 150 μm in a commercial manufacturing environment.

Figure 3F:
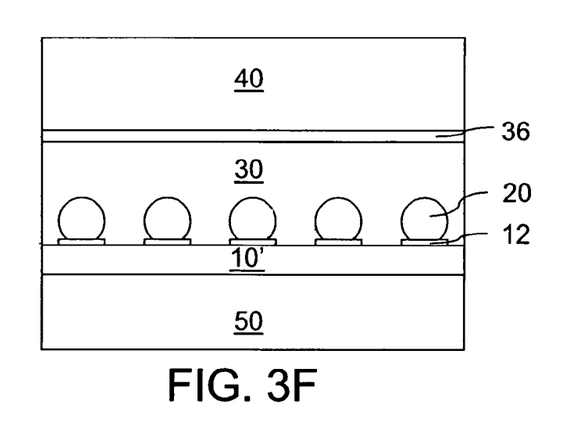

Referring to FIG. 3F, a film frame tape 50 is applied to the back side of the thinned semiconductor substrate 10'. The film frame tape 50 comprises an adhesive surface that may be applied and affixed to the bottom surface of the thinned semiconductor substrate 10'. The film frame tape 50 provides mechanical strength needed to support to the thinned semiconductor substrate 10' upon subsequent removal of the carrier substrate 40 from the adhesive tape 30. The thickness of the film frame tape may be from about 50 µm to about 600 µm, and typically from about 100 µm to about 300 µm, although lesser and greater thicknesses are also contemplated herein.

Figure 3G:
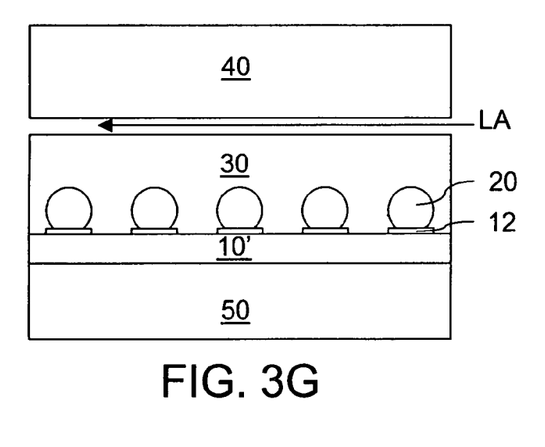

Referring to FIG. 3G, the laser-ablative adhesive layer 36 is removed by laser ablation. Methods described in U.S. Pat. No. 5,258,236 and Donelon et al., supra, may be employed. The beam energy of laser impinging on the laser-ablative adhesive layer 36 is set at a level that enables ablation of the material in the laser-ablative adhesive layer 36. While the beam energy of the laser required to induce laser ablation depends on the material in the in the laser-ablative adhesive layer 36, typically beam energy of at least 50 mJ/cm$^2$ is needed to induce laser ablation in the laser-ablative adhesive layer 36, although lesser energy ranges are also contemplated herein for new materials for the laser-ablative adhesive layer 36. The laser ablation removes the entirety of the laser-ablative adhesive layer 36, or a significant portion of the laser-ablative adhesive layer 36 to reduce the adhesion strength between the laser-ablative adhesion layer 36 and the carrier substrate 40 so that the carrier substrate 40 may be removed from the adhesive tape 30. The direction of the laser beam is schematically represented by an arrow labeled "LA." The carrier substrate 40 may be reused for bonding with another adhesive tape on another semiconductor substrate in a commercial manufacturing scheme. In other words, the carrier substrate 40 is not consumed, but recycled for additional usage.

Figure 3H:
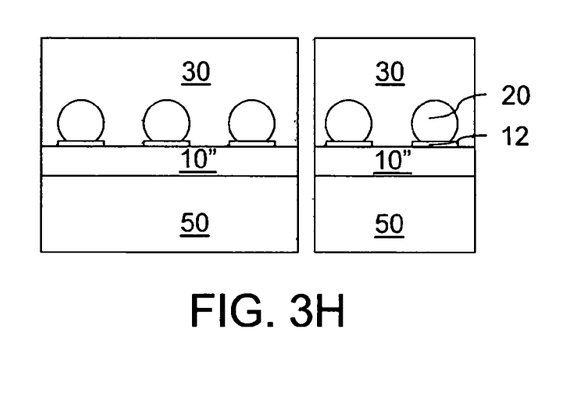

Referring to FIG. 3H, the first exemplary semiconductor structure, which at this point comprises a vertical stack of a film frame tape 50, a thinned semiconductor substrate 10' with C4 pads 12 and C4 balls 20 thereupon, and the adhesive tape 30, is diced employing dicing equipment. While the thinned semiconductor substrate 10' does not have sufficient mechanical strength to be subjected to a dicing process by itself, the film frame tape 50 provides mechanical support to the thinned semiconductor substrate 10', thereby maintaining structural integrity of the thinned semiconductor substrate 10' and avoiding breakage of the thinned semiconductor substrate 10'. The dicing is performed along dicing channels to separate semiconductor dies 10" individually. Each diced portion of the thinned semiconductor substrate 10' comprises the semiconductor dies 10". Typically, each semiconductor die 10" includes at least one functional semiconductor chip.

Figure 3I:
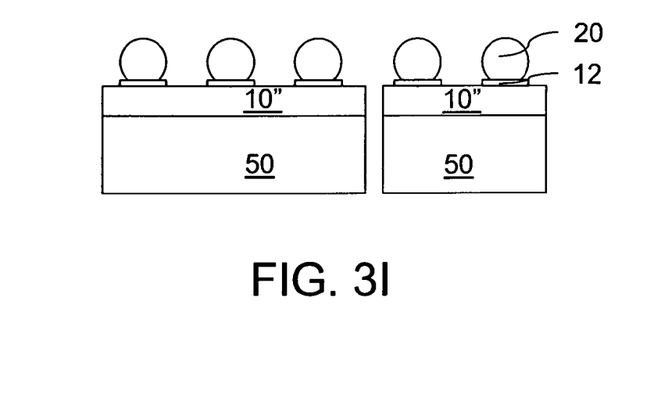

Referring to FIG. 3I, the adhesive tape 30 is deactivated by treating the adhesive tape 50 with a suitable deactivation mechanism, which renders the tape adhesive layer 30A (See FIG. 3B) substantially less adhesive than prior to the treatment. The deactivatable adhesive material in the tape adhesive layer 30A, which provides adhesive strength prior to deactivation, may be deactivated by ultraviolet (UV) radiation, heat, low temperature, chemical exposure, etc.

For example, if the deactivatable adhesive material comprises an olygamer that loses cross-linkage upon exposure to ultraviolet (UV) light, exposure to ultraviolet (UV) radiation is employed to induce a substantial loss of adhesive property of the tape adhesive layer 30A. Commercially available exemplary equipment for deactivating the adhesive tape 30 include Nitto™ UA8400 UV irradiator for dicing process, which reduces adhesive strength of UV deactivatable C4 grind tapes employing ultraviolet radiation.

Once the adhesive tape 30 substantially loses adhesion to the C4 balls 20 and the semiconductor dies 10", the adhesive tape 30 is removed by delamination, i.e., peeling off. The semiconductor dies 10" may be subsequently mounted to a packaging substrate (not shown), after which the film frame tape 50 may be removed. Alternately, the film frame tape 50 may be removed upon securing the semiconductor dies 10" to a fixed location in any other manner.

The semiconductor dies 10" may have a thickness less than about 150 µm, and preferably from about 20 µm to about 150 µm. C4 balls 20 and C4 pads 12 are formed on the semiconductor dies 10" to enable bonding to a packaging substrate. The thickness range of the semiconductor dies 10", which may be from about 20 µm to about 150 µm, enables formation of through wafer vias (TWVs) by forming a trench extending to a depth from about 20 µm to about 150 µm during a semiconductor manufacturing sequence without a need to form any deeper trenches in the semiconductor substrate. Thus, the present invention facilitates formation of TWVs at a reduced cost and reduced processing complexity, while enabling the full benefit of TWVs such as vertical chip stacking.

Figure 4A:
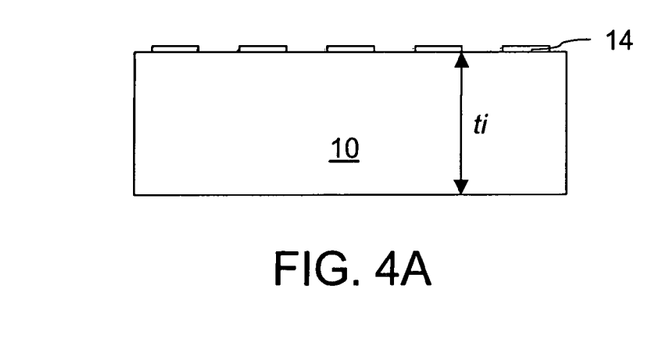

Referring to FIG. 4A, a second exemplary semiconductor structure according to a second embodiment of the present invention comprises a wirebond semiconductor substrate, which is a semiconductor substrate with wirebond pads 14 thereupon. Specifically, the second exemplary semiconductor structure comprises a semiconductor substrate 10 and an array of wirebond pads 14. The semiconductor substrate 10 comprises a substrate containing a semiconductor material as in the first embodiment. The semiconductor substrate 10 comprises at least one semiconductor device (not shown) electrically connected to the array of wirebond pads 14 through at least one metal interconnect structure (not shown). The thickness of the semiconductor substrate 10 is herein referred to as an initial thickness ti, and may be from about 500 µm to about 1,000 µm, although lesser and greater thicknesses are contemplated herein. Typically, the initial thickness ti is determined by the material of the semiconductor substrate 10 and the size, e.g., the diameter, of the semiconductor substrate 10.

Typical thickness of the wirebond pads 14 is from about 1 mm to about 5 mm, although lesser and greater thicknesses are contemplated herein. The lateral dimensions of the wirebond pads may be from about 50 µm to about 100 µm, although lesser and greater dimensions are also contemplated herein.

Figure 4B:
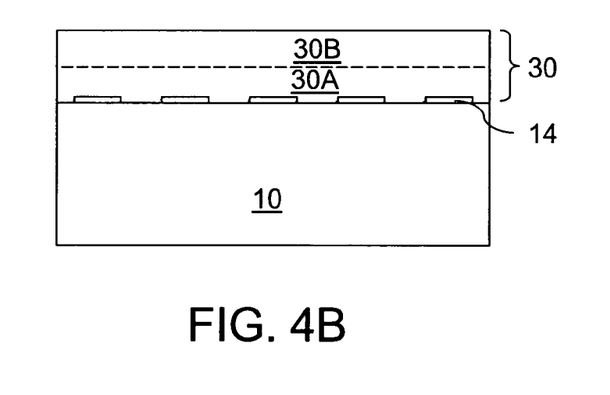

Referring to FIG. 4B, an adhesive tape 30 is applied over the top surface of the semiconductor layer 10 and the wirebond pads. The adhesive tape 30 comprises a tape base layer 30B and a tape adhesive layer 30A as in the first embodiment. The composition and thickness of the tape base layer 30B are the same as in the first embodiment. The composition and thickness of the tape adhesive layer 30A may be the same as in the first embodiment as well. In addition, the thickness of the tape adhesive layer 30A may be less than 100 µm. For example, the thickness of the tape adhesive layer 30A may be from about 10 µm to about 1,000 µm. The thickness of the tape base layer 20B may be from about 100 µm to about 200 µm, although lesser and greater thicknesses are also contemplated herein. Commercially available C4 grain tapes described above may be employed as the adhesive tape 30. The tape adhesive layer 30A is applied over the semiconductor substrate 10 and the wirebond pads 14 in a conformal manner to avoid forming bubbles between the tape adhesive layer 30A and the wirebond pads 14 and/or the semiconductor layer 10.

Figure 4C:
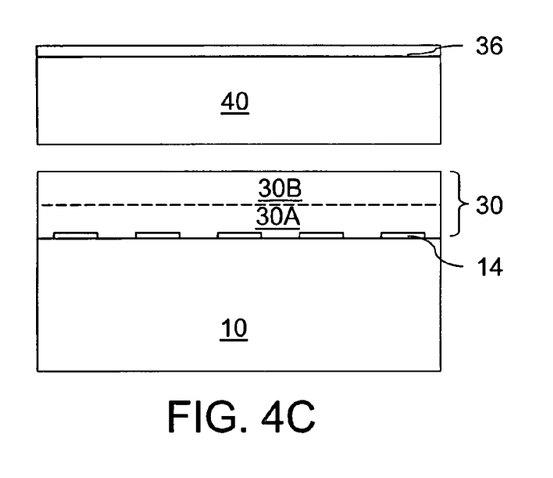

Referring to FIG. 4C, a carrier substrate 40 is provided, which has the same composition and structural characteristics as in the first embodiment. Preferably, size of the carrier substrate 40 and the size of the semiconductor substrate 10 are substantially the same. A laser-ablative adhesive layer 36 is applied over a surface of the carrier substrate 40 in the same manner as in the first embodiment.

Figure 4D:
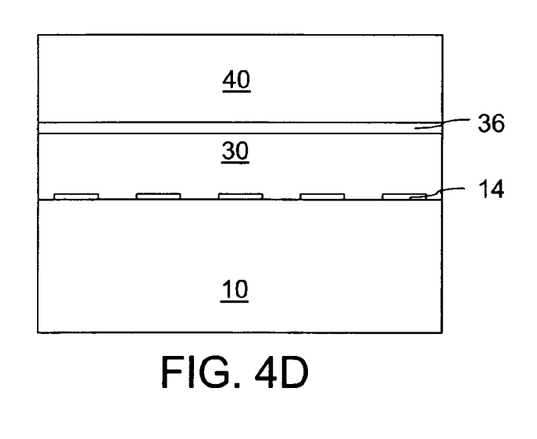

Referring to FIG. 4D, the side of the carrier substrate 40 having the laser-ablative adhesive layer 36 and the top surface of the adhesive tape 30, which is the exposed surface of the tape base layer 30B, are brought into contact. The carrier substrate 40 and the semiconductor substrate 10 are pressed against each other to bond the carrier substrate 40 with the assembly of the adhesive tape 30, the semiconductor substrate 10, and the wirebond pads 14 therebetween through the laser-ablative adhesive layer 36. To prevent formation of any air bubble, the bonding of the carrier substrate 40 with the adhesive tape 30 may be effected from one side of the laser-ablative adhesive layer 36 toward another side of the laser ablative adhesive layer 36.

Figure 4E:
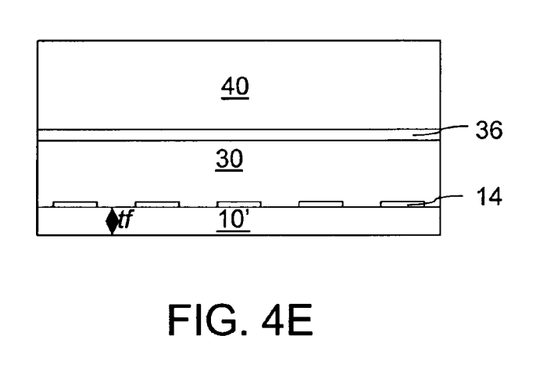

Referring to FIG. 4E, the semiconductor substrate 10 is thinned by polishing, grinding, or other equivalent methods so that material is removed from the bottom surface of the semiconductor substrate 10 in the same manner as in the first embodiment. The thickness of the semiconductor substrate 10 decreases from the initial thickness ti (See FIG. 4A) to a final thickness tf. The semiconductor substrate 10 having the final thickness tf is herein referred to as a thinned semiconductor substrate 10'. The carrier substrate 40 provides mechanical support to the semiconductor substrate 10 throughout the process of thinning. The final thickness tf of the thinned semiconductor substrate 10' may be from about 20 µm to about 150 µm without causing undue risk of breakage of the semiconductor substrate 10 during or after thinning.

Figure 4F:
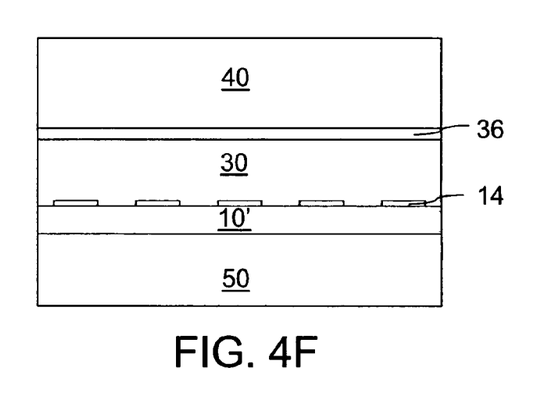

Referring to FIG. 4F, a film frame tape 50 is applied to the back side of the thinned semiconductor substrate 10' in the same manner as in the first embodiment.

Figure 4G:
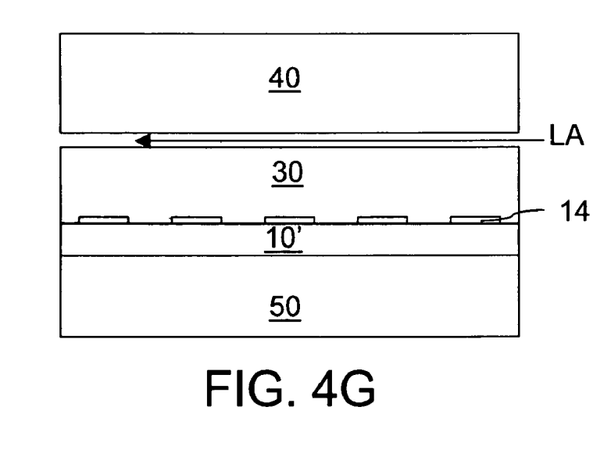

Referring to FIG. 4G, the laser-ablative adhesive layer 36 is removed by laser ablation in the same manner as in the first embodiment. The direction of the laser beam is schematically represented by an arrow labeled "LA." The carrier substrate 40 may be reused for bonding with another adhesive tape on another semiconductor substrate as in the first embodiment.

Figure 4H:
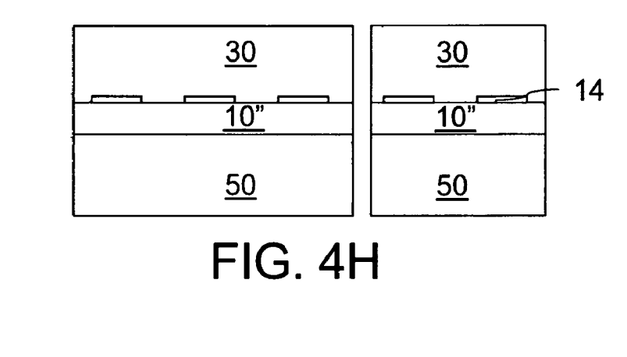

Referring to FIG. 4H, the second exemplary semiconductor structure, which at this point comprises a vertical stack of a film frame tape 50, a thinned semiconductor substrate 10' with wirebond pads 14 thereupon, and the adhesive tape 30, is diced employing dicing equipment. While the thinned semiconductor substrate 10' does not have sufficient mechanical strength to be subjected to a dicing process by itself, the film frame tape 50 provides mechanical support to the thinned semiconductor substrate 10', thereby maintaining structural integrity of the thinned semiconductor substrate 10' and avoiding breakage of the thinned semiconductor substrate 10'. The dicing is performed in the same manner as in the first embodiment to form semiconductor dies 10".

Figure 4I:
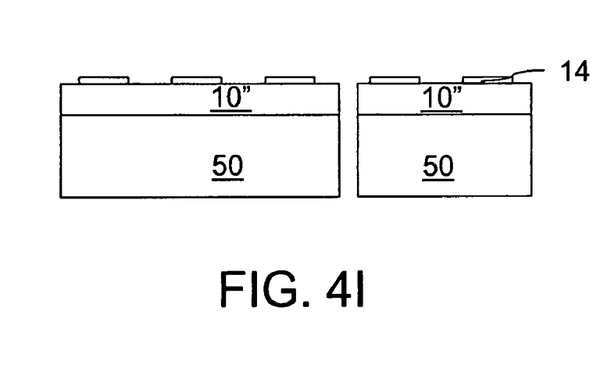

Referring to FIG. 4I, the adhesive tape 30 is deactivated as in the first embodiment. Once the adhesive tape 30 substantially loses adhesion to the wirebond pads 14 and the semiconductor dies 10", the adhesive tape 30 is removed by delamination. The semiconductor dies 10" may be subsequently mounted to a wirebond package (not shown), after which the film frame tape 50 may be removed. Alternately, the film frame tape 50 may be removed upon securing the semiconductor dies 10" to a fixed location in any other manner.

The semiconductor dies 10" may have a thickness less than about 150 µm, and preferably from about 20 µm to about 150 µm. Wirebond pads 14 are present on the semiconductor dies 10" to enable mounting on a wirebond package. The thickness range of the semiconductor dies 10", which may be from about 20 µm to about 150 µm, enables formation of through wafer vias (TWVs) by forming a trench extending to a depth from about 20 µm to about 150 µm during a semiconductor manufacturing sequence without a need to form any deeper trenches in the semiconductor substrate, providing a similar benefit as in the first embodiment.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
    applying an adhesive tape on a semiconductor substrate;
    applying a laser-ablative adhesive layer on a carrier substrate;
    bonding said adhesive tape to said laser-ablative adhesive layer;
    thinning a back side of said semiconductor substrate; applying a film frame tape to said back side of said thinned semiconductor substrate; and
    separating said carrier substrate from said adhesive tape by laser ablation of said laser-ablative adhesive layer.

2. The method of claim 1, wherein said semiconductor substrate is a C4 semiconductor substrate including C4 balls.

3. The method of claim 2, wherein said adhesive tape abuts said C4 balls.

4. The method of claim 1, wherein said semiconductor substrate is a wirebond semiconductor substrate including wirebond pads.

5. The method of claim 4, wherein said adhesive tape abuts said wirebond semiconductor substrate.

6. The method of claim 1, wherein said adhesive tape comprises a tape base layer and a tape adhesive layer, wherein said tape adhesive layer abuts said semiconductor substrate, and said carrier substrate abuts said tape base layer.

7. The method of claim 6, wherein said tape base layer comprises a polymer material or a plastic material.

8. The method of claim 6, wherein said tape adhesive layer comprises an ultraviolet (UV) sensitive adhesive material which loses adhesive property upon exposure to ultraviolet light.

9. The method of claim 6, wherein said tape adhesive layer has a thickness of at least 100 µm.

10. The method of claim 6, wherein said adhesive tape is a C4 grind tape.

11. The method of claim 1, wherein said laser-ablative adhesive layer comprises a polymeric material.

12. The method of claim 1, wherein beam energy of a laser impinging on said laser-ablative adhesive layer is at least 50 mJ/cm$^2$.

13. The method of claim 1, wherein said laser-ablative adhesive layer has a thickness from about 5 µm to about 25 µm.

14. The method of claim 1, wherein said carrier substrate is one of a quartz substrate, a glass substrate, a semiconductor substrate, a ceramic substrate, and a metallic substrate.

15. The method of claim 14, wherein said carrier substrate and said semiconductor substrate have substantially the same area.

16. The method of claim 1, wherein said semiconductor substrate has a thickness from about 500 μm to about 1,000 μm prior to thinning, and has a thickness from about 20 μm to about 150 μm after thinning.

17. The method of claim 1, further comprising dicing an assembly of said film frame tape, said semiconductor substrate, and said adhesive tape.

18. The method of claim 17, further comprising:
deactivating said adhesive tape, whereby adhesive strength of said adhesive tape is reduced; and
delaminating said adhesive tape off said semiconductor substrate.

* * * * *